(12) United States Patent
Liu

(10) Patent No.: US 10,192,904 B2
(45) Date of Patent: Jan. 29, 2019

(54) ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventor: Xiang Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/432,048

(22) PCT Filed: Jul. 25, 2014

(86) PCT No.: PCT/CN2014/083086
§ 371 (c)(1),
(2) Date: Mar. 27, 2015

(87) PCT Pub. No.: WO2015/074439
PCT Pub. Date: May 28, 2015

(65) Prior Publication Data
US 2016/0027820 A1    Jan. 28, 2016

(30) Foreign Application Priority Data

Nov. 22, 2013 (CN) .......................... 2013 1 0597112

(51) Int. Cl.
*H01L 27/12* (2006.01)
*H01L 21/02* (2006.01)
(Continued)

(52) U.S. Cl.
CPC ...... *H01L 27/1288* (2013.01); *H01L 21/0274* (2013.01); *H01L 21/02565* (2013.01);
(Continued)

(58) Field of Classification Search
CPC .................................................. H01L 27/1288
See application file for complete search history.

(56) References Cited

U.S. PATENT DOCUMENTS

2003/0071944 A1* 4/2003 Baek ................. G02F 1/133555
349/113
2004/0183130 A1* 9/2004 Hara .................... H01L 29/4908
257/331
(Continued)

FOREIGN PATENT DOCUMENTS

CN           101109876 A     1/2008
CN           102569185 A     7/2012
(Continued)

OTHER PUBLICATIONS

Aug. 3, 2015—(CN)—First Office Action Appn 20130597112.5 with Eng Tran.
(Continued)

*Primary Examiner* — Eugene Lee
(74) *Attorney, Agent, or Firm* — Banner & Witcoff, Ltd.

(57) ABSTRACT

A manufacturing method of an array substrate, including: forming a pattern layer including a pixel electrode, and a pattern layer including a gate electrode and a gate line on a base substrate; on the substrate with the pattern layer including the gate electrode and the gate line formed thereon, forming a gate insulating layer, a pattern layer at least including a metal oxide semiconductor active layer and a pattern layer at least including an etch stop layer; wherein, a first via hole for exposing the pixel electrode is formed over the pixel electrode; on the substrate with the etch stop layer formed thereon, forming a pattern layer including a source electrode, a drain electrode and a data line; wherein, the source electrode and the drain electrode each contact a metal oxide semiconductor active layer, and the drain elec-
(Continued)

trode is electrically connected to the pixel electrode through the first via hole.

18 Claims, 8 Drawing Sheets

(51) Int. Cl.
| | |
|---|---|
| *H01L 21/441* | (2006.01) |
| *H01L 21/469* | (2006.01) |
| *H01L 21/4757* | (2006.01) |
| *H01L 21/4763* | (2006.01) |
| *H01L 21/56* | (2006.01) |
| *H01L 21/768* | (2006.01) |
| *H01L 23/31* | (2006.01) |
| *H01L 23/522* | (2006.01) |
| *H01L 23/528* | (2006.01) |
| *H01L 29/24* | (2006.01) |
| *H01L 29/66* | (2006.01) |
| *H01L 29/786* | (2006.01) |
| *H01L 21/28* | (2006.01) |
| *H01L 21/027* | (2006.01) |
| *H01L 21/311* | (2006.01) |
| *H01L 21/3213* | (2006.01) |
| *H01L 29/49* | (2006.01) |

(52) U.S. Cl.
CPC .. *H01L 21/28008* (2013.01); *H01L 21/31144* (2013.01); *H01L 21/32139* (2013.01); *H01L 21/441* (2013.01); *H01L 21/469* (2013.01); *H01L 21/47573* (2013.01); *H01L 21/47635* (2013.01); *H01L 21/56* (2013.01); *H01L 21/76831* (2013.01); *H01L 23/3171* (2013.01); *H01L 23/528* (2013.01); *H01L 23/5226* (2013.01); *H01L 27/124* (2013.01); *H01L 27/127* (2013.01); *H01L 27/1225* (2013.01); *H01L 27/1259* (2013.01); *H01L 29/24* (2013.01); *H01L 29/4908* (2013.01); *H01L 29/66969* (2013.01); *H01L 29/7869* (2013.01); *H01L 2924/0002* (2013.01)

(56) References Cited

U.S. PATENT DOCUMENTS

| | | | |
|---|---|---|---|
| 2004/0183978 A1* | 9/2004 | Jeoung | G02F 1/134363 349/141 |
| 2007/0146566 A1* | 6/2007 | Hosoya | G02F 1/1362 349/43 |
| 2011/0042668 A1* | 2/2011 | Hama | H01L 29/7869 257/43 |
| 2011/0057918 A1* | 3/2011 | Kimura | G09G 3/3648 345/211 |
| 2014/0292827 A1* | 10/2014 | Kang | G09G 3/20 345/690 |
| 2014/0368779 A1* | 12/2014 | Park | G02F 1/133788 349/124 |

FOREIGN PATENT DOCUMENTS

| | | |
|---|---|---|
| CN | 102629051 A | 8/2012 |
| CN | 102983135 A | 3/2013 |
| CN | 103208491 A | 7/2013 |
| CN | 103560110 A | 2/2014 |
| WO | 2012172985 A1 | 12/2012 |

OTHER PUBLICATIONS

Nov. 9, 2015—(CN)—Second Office Action Appn 201310597112.5 with English Tran.

Oct. 14, 2014—International Search Report for Appn PCT/CN2014/083086 with Eng Tran of Written Opinion.

May 31, 2017—(EP) Extended European Search Report Appn 14859300.7.

\* cited by examiner

ARRAY SUBSTRATE AND MANUFACTURING METHOD THEREOF, DISPLAY DEVICE

The application is a U.S. National Phase Entry of International Application No. PCT/CN2014/083086 filed on Jul. 25, 2014, designating the United States of America and claiming priority to Chinese Patent Application No. 201310597112.5 filed on Nov. 22, 2013. The present application claims priority to and the benefit of the above-identified applications and the above-identified applications are incorporated by reference herein in their entirety.

TECHNICAL FIELD

Embodiments of the present invention relate to an array substrate and a manufacturing method thereof, a display device.

BACKGROUND

Depending on diverse materials used for an active layer in a Thin Film Transistor (briefly called as TFT), TFTs can be classified into amorphous silicon TFTs, polycrystalline silicon TFTs, mono-crystalline silicon TFTs and metal oxide semiconductor TFTs. Metal oxide semiconductor TFTs have a higher carrier mobility, and can better meet the driving requirements of ultra large-scale liquid crystal displays. And, the metal oxide semiconductor TFTs also have the traits of uniform constituents, lower cost, higher transparency, etc., and thus attract a lot of attentions of research staff.

In prior art, when a metal layer for a source electrode and a drain electrode over a metal oxide semiconductor active layer is formed by etch, the metal oxide semiconductor active layer may often be etched by an etching liquid of the metal layer for the source electrode and the drain electrode, resulting in degradation of yield of metal oxide semiconductor TFTs. Therefore, it is necessary that an etch stop layer be formed over the metal oxide semiconductor active layer, acting to prevent the metal oxide semiconductor active layer from being corroded by the etching liquid of the source electrode and the drain electrode.

Currently, it is generally required that at least six patterning processes be used to manufacture a metal oxide semiconductor TFT array substrate having an etch stop layer, and they specifically include technological processes of forming a pattern layer that includes a gate electrode, forming a gate insulating layer, forming a metal oxide semiconductor active layer, forming an etch stop layer, forming a pattern layer that includes a gate electrode and a drain electrode, and forming a pixel electrode. And each patterning process includes film formation, exposure, development, etching, stripping and other process. Obviously, the more the patterning process is carried out, the higher the fabricating cost of the TFT array substrate is, and accordingly, this will cause the technological difficulty of fabrication of the TFT array substrate to increase. In turn, instability of the performance of the TFT array substrate may result, namely, it leads to a lower yield of the TFT array substrate. Therefore, how to decrease the number of patterning processes used in the manufacturing process of a metal oxide semiconductor TFT array substrate is an important technical problem that needs solving urgently.

SUMMARY

According to an embodiment of the present invention, there is provided a manufacturing method of an array substrate, comprising: forming a pattern layer including a pixel electrode and a pattern layer including a gate electrode and a gate line on a base substrate through one patterning process; on the substrate with the pattern layer including the gate electrode and the gate line formed thereon, through one patterning process or two patterning processes, forming a gate insulating layer, a pattern layer at least including a metal oxide semiconductor active layer and a pattern layer at least including an etch stop layer; wherein, a first via hole for exposing the pixel electrode is formed over the pixel electrode; on the substrate with the etch stop layer formed thereon, through one patterning process, forming a pattern layer including a source electrode, a drain electrode and a data line; wherein, the source electrode and the drain electrode each contact with the metal oxide semiconductor active layer, and the drain electrode and the pixel electrode are electrically connected through the first via hole.

According to an embodiment of the invention, there is further provided an array substrate manufactured by using the above method, comprising: a pattern layer including a gate electrode and a gate line, a gate insulating layer, a metal oxide semiconductor active layer, a pixel electrode, and a pattern layer including a source electrode, a drain electrode and a data line; wherein, the array substrate further includes: a transparent conductive pattern layer disposed under the pattern layer including the gate electrode and the gate line, the transparent conductive pattern lying in the same layer as the pixel electrode; an etch stop layer disposed over the metal oxide semiconductor active layer; wherein, the source electrode and the drain electrode are located above the etch stop layer, and the drain electrode is electrically connected to the pixel electrode through a first via hole located over the pixel electrode.

According to an embodiment of the invention, there is further provided a display device, including the array substrate as stated in any of the above items.

With respect to an array substrate and manufacturing method thereof, a display device provided by embodiments of the invention, through three patterning processes or through fourth patterning processes, the array substrate can be formed. As compared with six patterning processes in prior art, the number of patterning processes in the manufacturing process of the array substrate is obviously simplified by the manufacturing method of an array substrate provided by embodiments of the invention. Thereby, the production efficiency of the array substrate is enhanced, and the production cost of the array substrate is reduced.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

Figure 1:
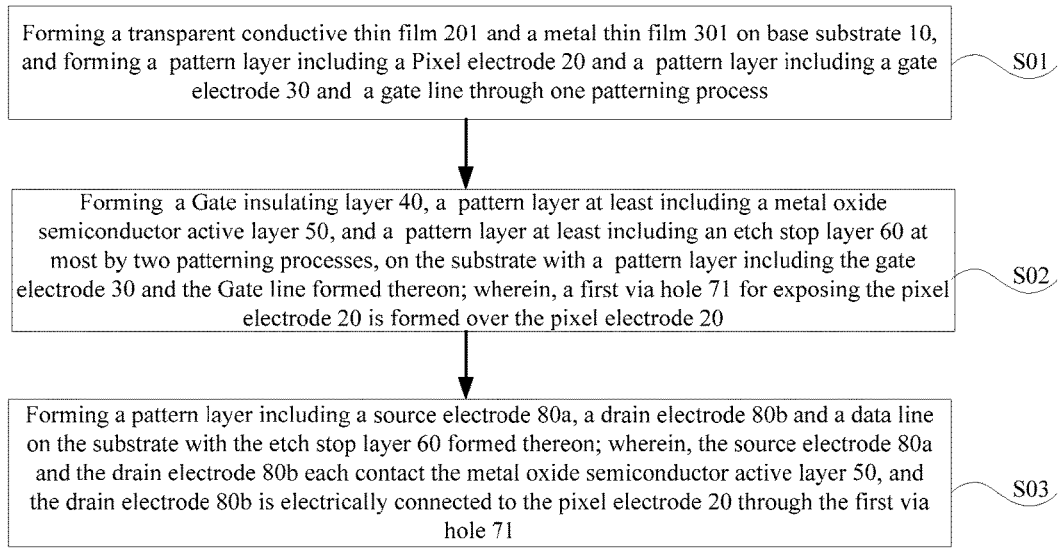
FIG. 1 is a schematic view illustrating a fabricating flow of fabricating an array substrate provided by an embodiment of the invention.

According to an embodiment of the invention, there is provided a manufacturing method of an array substrate 01. As illustrated in FIG. 1, the manufacturing method includes the following three main steps:

S01, a pattern layer including a pixel electrode 20 and a pattern layer including a gate electrode 30 and a gate line 30 are formed on a base substrate 10 through one patterning process.

S02, on the substrate with the pattern layer including the gate electrode 30 and the gate line formed thereon, a gate insulating layer 40, a pattern layer at least including the metal oxide semiconductor active layer 50 and a pattern layer at least including an etch stop layer 60 are formed through two patterning processes at most (through one patterning process or two patterning processes).

A first via hole 71 through which the pixel electrode 20 is exposed is formed over the pixel electrode 20.

S03, on the substrate with the etch stop layer 60 formed thereon, a pattern layer including a source electrode 80a, a drain electrode 80b and a data line is formed through one patterning process.

Each of the source electrode 80a and the drain electrode 80b contacts with the metal oxide semiconductor active layer 50, and the drain electrode 80b is electrically connected to the pixel electrode 20 through the first via hole 71.

It is to be noted that, firstly, although a gate-line lead wire is not mentioned in embodiments of the invention, those skilled in the art shall understand that, while the gate electrode 30 and the gate line 30 are formed through one patterning process, a gate-line lead wire connected to the gate line is also formed. Of course, while a pattern layer including the source electrode 80a, the drain electrode 80b and the data line 80a is formed through one patterning process, a data-line lead wire connected to the data line 80a is also formed.

Secondly, the above step S02 means that, through one patterning process or through two patterning processes, the gate insulating layer 40, the metal oxide semiconductor active layer 50 and the etch stop layer 60 can be fully formed, and the first via hole 71 through which the pixel electrode 20 is exposed is formed over the pixel electrode 20.

The first via hole 71 at least penetrates the gate insulating layer 40. In the case of employing one patterning process, the first via hole 71 penetrates the gate insulating layer 40, the metal oxide semiconductor active layer 50 and the etch stop layer 60 at the same time. That is, the first via hole 71 is present on each of the gate insulating layer 40, the metal oxide semiconductor active layer 50 and the etch stop layer 60. In the case of employing two patterning processes, the first via hole 71 penetrates the gate insulating layer 40. That is, the first via hole 71 is included in the gate insulating layer 40.

Thirdly, in all embodiments of the invention, the one patterning process is correlative with application of one masking process, and some pattern layer having a certain pattern being manufactured and finished by applying one mask is called as execution of one patterning process. The mask may be a normal mask, a half-tone mask or a gray-tone mask.

According to an embodiment of the invention, there is provided a manufacturing method of an array substrate 01, which includes that, a pattern layer including a pixel electrode 20 and a pattern layer including a gate electrode 30 and a gate line 30 are formed on a base substrate 10 through one patterning process; on the substrate with the pattern layer including the gate electrode 30 and the gate line 30 formed thereon, the gate insulating layer 40, a pattern layer at least including the metal oxide semiconductor active layer 50, and a pattern layer at least including the etch stop layer 60 are formed at most by two patterning processes (through one patterning process or two patterning processes), wherein, a first via hole 71 through which the pixel electrode 20 is exposed is formed over the pixel electrode 20; a pattern layer including a source electrode 80a, a drain electrode 80b and a data line 80a is formed on the substrate with the etch stop layer 60 formed thereon, wherein, each of the source electrode 80a and the drain electrode 80b contacts with the metal oxide semiconductor active layer 50, and the drain electrode 80b is electrically connected to the pixel electrode 20 through the first via hole 71.

In embodiments of the invention, through three patterning processes or through four patterning processes, the array substrate 01 can be formed. As compared with six patterning processes in prior art, the number of patterning processes during manufacture of the array substrate 01 is obviously simplified by embodiments of the invention. Thus, the production efficiency of the array substrate is enhanced, and the production cost of the array substrate 01 is reduced.

Figure 2:
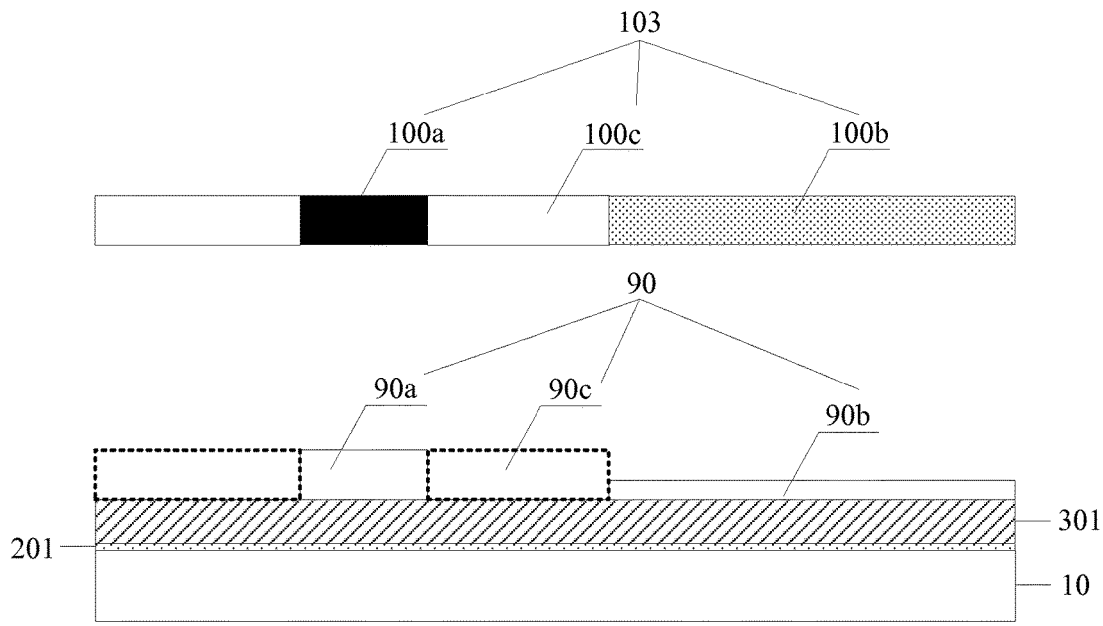
FIG. 2 is a schematic view 1 illustrating a fabrication process of forming a pixel electrode, a gate electrode and a gate line through one patterning process provided by an embodiment of the invention.

For the above step S01, for example, it may include the following five sub-steps:

S11, as illustrated in FIG. 2, a transparent conductive thin film 201 and a metal thin film 301 are sequentially formed on the base substrate 10, and photoresist 90 is formed on the metal thin film 301. The base substrate 10 with the photoresist 90 formed thereon is exposed with a third gray-tone mask or a third half-tone mask 103, and after development, a photoresist fully-retained portion 90a, a photoresist half-retained portion 90b and a photoresist fully-removed portion 90c are formed. The photoresist fully-retained portion 90a corresponds to a region where a pattern layer including the gate electrode 30 and the gate line 30 is to be formed, the photoresist half-retained portion 90b corresponds to a region where a pattern layer including the pixel electrode 20 is to be formed, and the photoresist fully-removed portion 90c corresponds to other region.

Here, the transparent conductive thin film 201 may adopt an Indium Tin Oxide (briefly called as ITO), Indium Zinc Oxide (briefly called as IZO) or other transparent conductive material; and the metal thin film 301 may adopt chromium (Cr), tungsten (W), copper (Cu), titanium (Ti), tantalum (Ta), molybdenum (Mo) or other metallic elementary substance, or a metallic alloy material thereof. The transparent conductive thin film 201 and the metal thin film 301 may be sequentially deposited on the base substrate 10 by way of, such as sputtering or thermal evaporation. Thickness range of the transparent conductive thin film 201 may be, such as 300 to 1500 Å, and thickness range of the metal thin film 301 may be, such as 2000 to 10000 Å.

Here, the working principle of a normal mask is explained firstly, so as to better understand the working principle of the above half-tone mask.

The normal mask refers to such a device that a light shading metal layer with a certain pattern is formed on a transparent base material, so as to achieve selective exposure of the photoresist 90. Regions covered by the light shading metal layer are fully opaque, while regions not covered by the light shading metal layer are fully transparent. When the photoresist 90 is exposed by the normal mask, as ultraviolet lights cannot irradiate the photoresist 90 corresponding to the fully opaque portions of the normal mask, it is formed to be the photoresist fully-retained portion 90a after development; while for the photoresist 90 corresponding to the fully-transparent portions of the normal mask, it is formed to be the photoresist fully-removed portion 90c after development. By doing this, when at least one layer of thin film covered by the photoresist 90 is etched, the thin film covered by the photoresist fully-retained portion 90a will all be retained, while the thin film covered by the photoresist fully-removed portion 90c will be fully removed by etch, so as to form at least one pattern layer having a characteristic pattern.

Through the use of the above normal mask, the pattern formed by the above at least one pattern layer is all the same; and when at least two pattern layers having different patterns need to be obtained by one patterning process, it is necessary to use the above half-tone mask or gray-tone mask.

With a half-tone mask 103 as an example, referring to that illustrated in FIG. 2, when the half-tone mask 103 is compared with the normal mask, the half-tone mask 103 not only includes a fully opaque portion 100a and a fully transparent portion 100c, but also includes a semitransparent portion 100b. Namely, the half-tone mask 103 refers to the case where a light shading metal layer that is light-tight is formed in some areas on a transparent base material, a light shading metal layer that is semitransparent is formed in some other areas, and any light shading metal layer is not formed in other region. Thickness of the light shading metal layer that is semitransparent is smaller than thickness of the light shading metal layer that is fully light-tight. In addition, transmittance of the light shading metal layer that is semitransparent to ultraviolent light may be changed by adjusting thickness of the light shading metal layer that is semitransparent.

On the basis of the above descriptions, the working principle of the half-tone mask 103 is explained as follows. By means of controlling thicknesses of light shading metal layers at different areas on the half-tone mask 103, intensity of transmitted lights at different areas by exposure differ. Thus, after a selective exposure and development is conducted on the photoresist 90, a photoresist fully-retained portion 90a, a photoresist half-retained portion 90b and a photoresist fully-removed portion 90c respectively corresponding to the fully opaque portion 100a, the semitransparent portion 100b and the fully transparent portion 100c of the half-tone mask 103 are formed. As such, upon the first etch, a thin film covered by the photoresist fully-retained portion 90a and the photoresist half-retained portion 90b will all be retained. After that, because thickness of the photoresist fully-retained portion 90a is larger than thickness of the photoresist half-retained portion 90b, after the photoresist of the photoresist half-retained portion 90b is removed by ashing, the photoresist of the photoresist fully-retained portion 90a still exists. Thus, the thin film of exposed portions may be selectively etched, so that at least two pattern layers having different patterns can be obtained.

The principle of the gray-tone mask is similar to the principle of the half-tone mask 103, and details are omitted here. Only differences between the gray-tone mask and the half-tone mask 103 will be described. Regarding the semitransparent portion 100b of the half-tone mask 103, by means of forming a light shading metal layer that is semitransparent and has a relatively thinner thickness on the transparent base material, namely, ultraviolet light transmittance is adjusted by controlling thickness of the metal layer, and thus exposure amount of the photoresist corresponding to this portion is different from exposure amount in other region. While as for a semitransparent portion of the gray-tone mask, by means of manufacturing some strip-like slit structures, scattering, diffraction and other optical phenomena occur when ultraviolet lights pass through the slit structures, and thus exposure amount of the photoresist 90 corresponding to this portion is different from exposure amount in other region.

The photoresist 90 mentioned in every embodiment of the invention is a positive photoresist. That is, a region corresponding to the photoresist fully-removed portion 90c is a fully-exposed region, which corresponds to a fully transparent portion 100c of the half-tone mask 103 or gray-tone mask; a region corresponding to the photoresist half-retained portion 90b is a half-exposed region, which corresponds to the semitransparent portion 100b of the half-tone mask 103 or gray-tone mask; and a region corresponding to the photoresist fully-retained portion 90a is a non-exposed region, which corresponds to the fully opaque portion 100a of the half-tone mask 103 or gray-tone mask.

Figure 3:
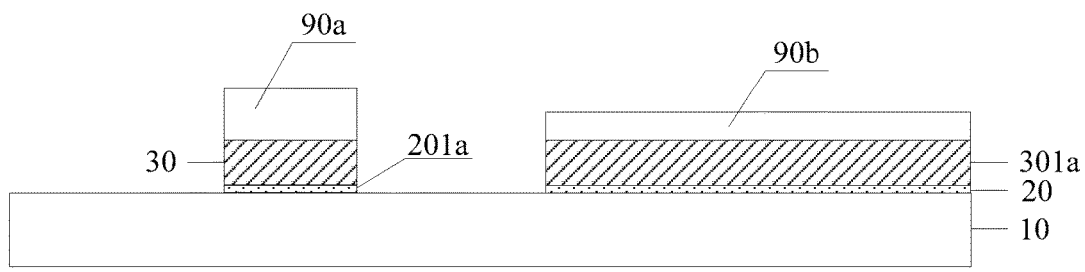
FIG. 3 is a schematic view 2 illustrating a fabrication process of forming a pixel electrode, a gate electrode and a gate line through one patterning process provided by an embodiment of the invention.

S12, on the substrate subjected to step S11, as illustrated in FIG. 3, the metal thin film 301 and the transparent conductive thin film 201 of the photoresist fully-removed portion 90c are removed by using an etch process, so as to form a pattern layer including the gate electrode 30 and the gate line 30 as well as a transparent conductive pattern layer 201a under the pattern layer including the gate electrode 30 and the gate line 30, the pixel electrode 20 and a part of the metal thin film 301a over the pixel electrode 20.

Figure 4:
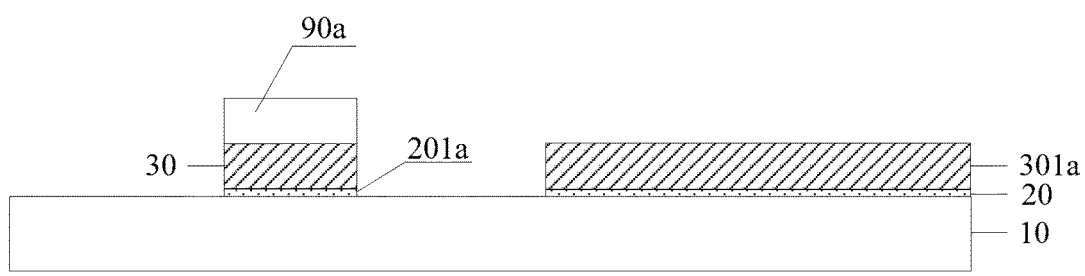
FIG. 4 is a schematic view 3 illustrating a fabrication process of forming a pixel electrode, a gate electrode and a gate line through one patterning process provided by an embodiment of the invention.

S13, on the substrate subjected to step S12, as illustrated in FIG. 4, the photoresist of the photoresist half-retained portion 90b is removed using ashing process.

Figure 5:
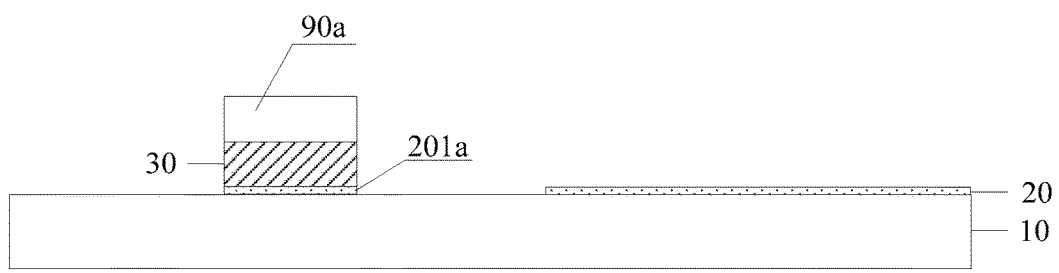
FIG. 5 is a schematic view 4 illustrating a fabrication process of forming a pixel electrode, a gate electrode and a gate line through one patterning process provided by an embodiment of the invention.

S14, on the substrate subjected to step S13, as illustrated in FIG. 5, the part of the metal thin film 301a over the pixel electrode 20 that has been exposed is removed using etching process.

Figure 6:
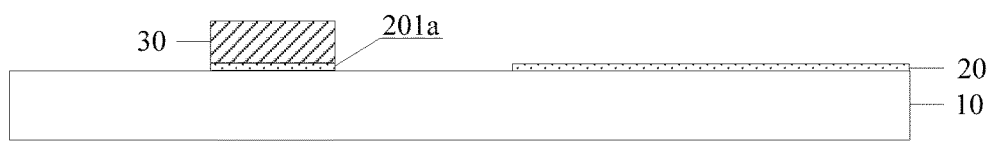
FIG. 6 is a schematic view 5 illustrating a fabrication process of forming a pixel electrode, a gate electrode and a gate line through one patterning process provided by an embodiment of the invention.

S15, on the substrate subjected to step S14, as illustrated in FIG. 6, the photoresist of the photoresist fully-retained portion 90a is removed using stripping process, so as to expose the gate electrode 30 and the gate line 30.

By the above steps S11 to S15, the pattern layer including the gate electrode 30 and the gate line 30, the pixel electrode 20 and a transparent conductive pattern layer 201a that lies in the same layer as the pixel electrode and situates under the pattern layer including the gate electrode 30 and the gate line 30 are formed on the base substrate 10.

For the above step S02, optionally, it may include the following two implementing manners.

Figure 7:
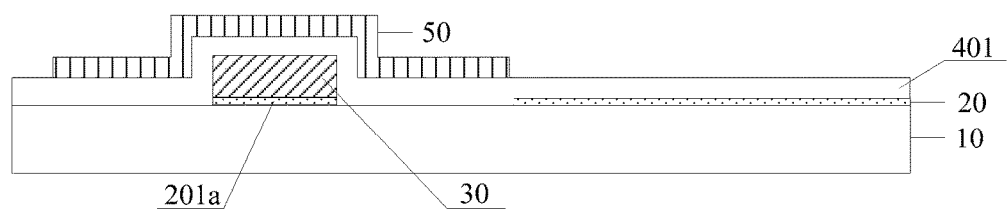
FIG. 7 is a schematic view 1 illustrating a fabrication process of forming a gate insulating layer, a metal oxide semiconductor active layer and an etch stop layer through two patterning processes provided by an embodiment of the invention.

In a first manner, it may specifically include the following seven sub-steps:

S211, as illustrated in FIG. 7, on the basis of above S11 to S15, a gate insulating layer thin film 401 is formed, and the metal oxide semiconductor active layer 50 is formed on the gate insulating layer thin film 401 through one patterning process.

Here, it is possible that the metal oxide semiconductor active layer 50 is formed on the substrate with the gate insulating layer thin film 401 formed thereon by using a normal mask with one patterning process, and the concrete patterning process will not be described any more.

The gate insulating layer thin film 401 may be deposited by way of, such as, Plasma Enhanced Chemical Vapor Deposition (briefly called as PECVD), and its thickness range may be, such as 2000 Å to 8000 Å. Before the metal oxide semiconductor active layer 50 is formed, for example, an Indium Gallium Zinc Oxide (briefly called as IGZO) thin film may be deposited by way of sputtering or thermal evaporation, and its thickness range may be, such as 100 Å to 2000 Å.

Figure 8:
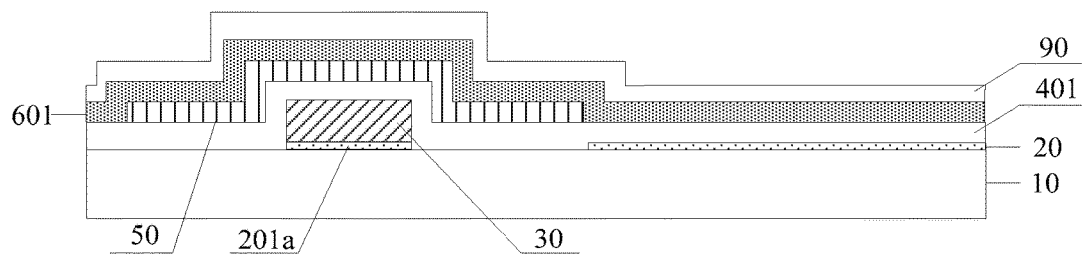
FIG. 8 is a schematic view 2 illustrating a fabrication process of forming a gate insulating layer, a metal oxide semiconductor active layer and an etch stop layer through two patterning processes provided by an embodiment of the invention.

S212, on the substrate subjected to step S211, as illustrated in FIG. 8, an etch stop layer thin film 601 is formed on the substrate with the metal oxide semiconductor active layer 50 formed thereon, and photoresist 90 is formed on the etch stop layer thin film.

The etch stop layer thin film 601, for example, may be deposited by way of PECVD, and its thickness range may be, such as, 500 Å to 4000 Å.

Figure 9:
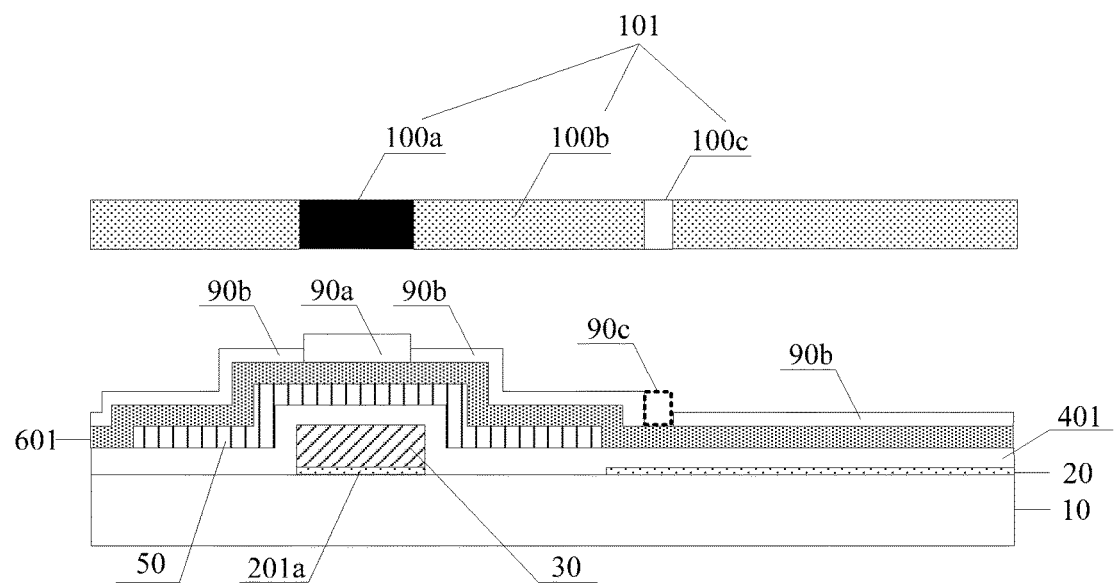
FIG. 9 is a schematic view 3 illustrating a fabrication process of forming a gate insulating layer, a metal oxide semiconductor active layer and an etch stop layer through two patterning processes provided by an embodiment of the invention.

S213, on the substrate subjected to step S212, as illustrated in FIG. 9, the base substrate with the photoresist 90 formed thereon is exposed with a first gray-tone mask or a first half-tone mask 101, and after development, a photoresist fully-retained portion 90a, a photoresist half-retained portion 90b and a photoresist fully-removed portion 90c are formed.

The photoresist fully-retained portion 90a corresponds to a region where the etch stop layer 60 is to be formed, the photoresist fully-removed portion 90c corresponds to a region where the first via hole 71 is to be formed, and the photoresist half-retained portion 90c corresponds to other region.

Figure 10:
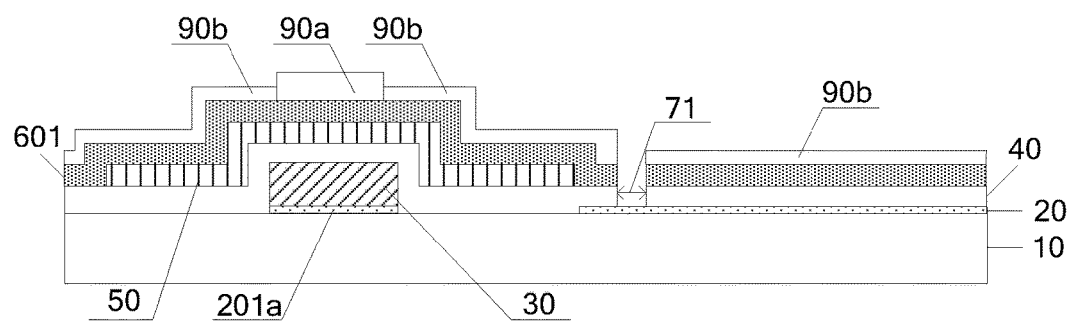
FIG. 10 is a schematic view 4 illustrating a fabrication process of forming a gate insulating layer, a metal oxide semiconductor active layer and an etch stop layer through two patterning processes provided by an embodiment of the invention.

S214, on the substrate subjected to step S213, as illustrated in FIG. 10, the etch stop layer thin film 601 and the gate insulating layer thin film 401 of the photoresist fully-removed portion 90c are removed using etch process, so as to form the gate insulating layer 40 with the first via hole 71.

Figure 11:
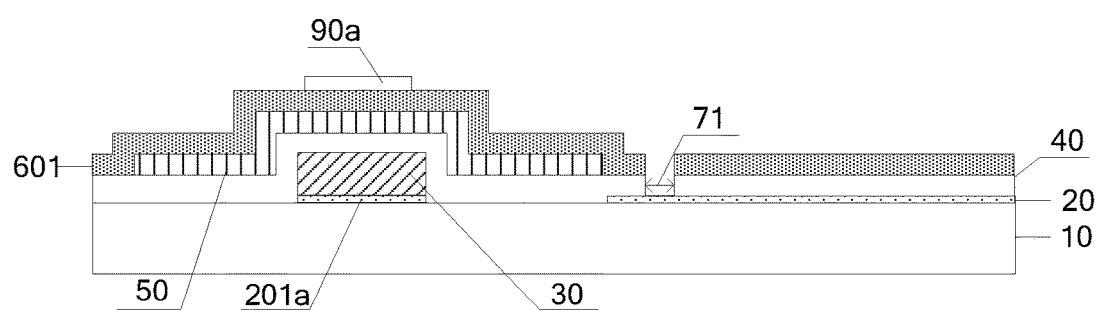
FIG. 11 is a schematic view 5 illustrating a fabrication process of forming a gate insulating layer, a metal oxide semiconductor active layer and an etch stop layer through two patterning processes provided by an embodiment of the invention.

S215, on the substrate subjected to step S214, as illustrated in FIG. 11, the photoresist of the photoresist half-retained portion 90b is removed using ashing process.

Figure 12:
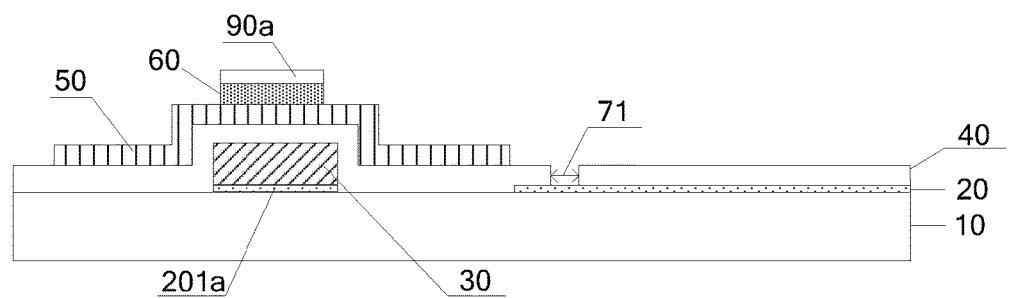
FIG. 12 is a schematic view 6 illustrating a fabrication process of forming a gate insulating layer, a metal oxide semiconductor active layer and an etch stop layer through two patterning processes provided by an embodiment of the invention.

S216, on the substrate subjected to step S215, as illustrated in FIG. 12, the exposed etch stop layer thin film 601 is removed using etch process, so as to form the etch stop layer 60.

Here, considering that when the exposed etch stop layer thin film 601 is removed by etch, if material of the etch stop layer thin film 601 and material used for the gate insulating layer 40 are the same, then the gate insulating layer 40 will also be removed by etch at the same time, material of the etch stop layer thin film 601 and material used for the gate insulating layer 40 shall not be the same. For example, in the event that the gate insulating layer 40 adopts silicon oxide, silicon nitride, silicon oxynitride or other material, the etch stop layer thin film 601 may adopt aluminum oxide or other distinct material.

Figure 13:
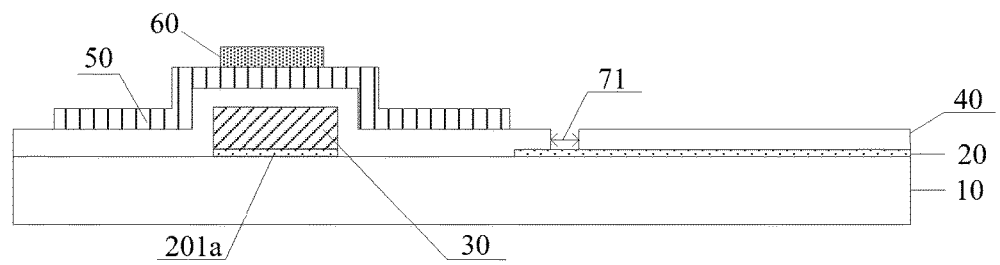
FIG. 13 is a schematic view 7 illustrating a fabrication process of forming a gate insulating layer, a metal oxide semiconductor active layer and an etch stop layer through two patterning processes provided by an embodiment of the invention.

S217, on the substrate subjected to step S216, as illustrated in FIG. 13, the photoresist of the photoresist fully-retained portion 90a is removed using stripping process, so as to expose the etch stop layer.

Figure 14:
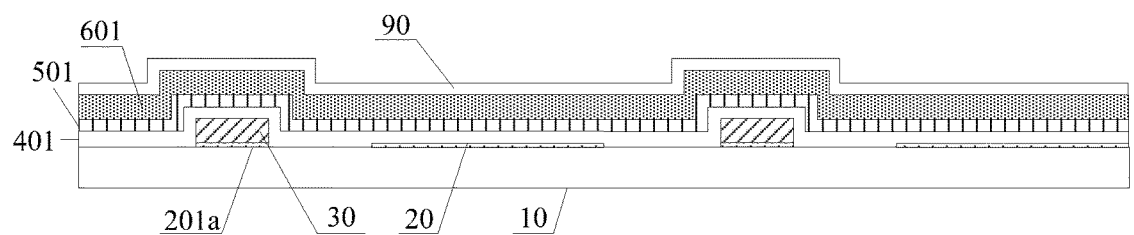
FIG. 14 is a schematic view 1 illustrating a fabrication process of forming a gate insulating layer, a metal oxide semiconductor active layer and an etch stop layer through one patterning process provided by an embodiment of the invention.

In a second manner, it may specifically include the following six sub-steps:

S221, as illustrated in FIG. 14, on the basis of above S11 to S15, the gate insulating layer thin film 401, a metal oxide semiconductor active layer thin film 501 and the etch stop layer thin film 601 are sequentially formed, and photoresist 90 is formed on the etch stop layer thin film 601.

Here, in order to better understand the method of manufacturing the array substrate 01 provided by embodiments of the invention, as regards the S221 to S226 steps, descriptions will be given by taking the first pixel unit and the second pixel unit to be formed at an edge of the array substrate 01 as an example.

Figure 15:
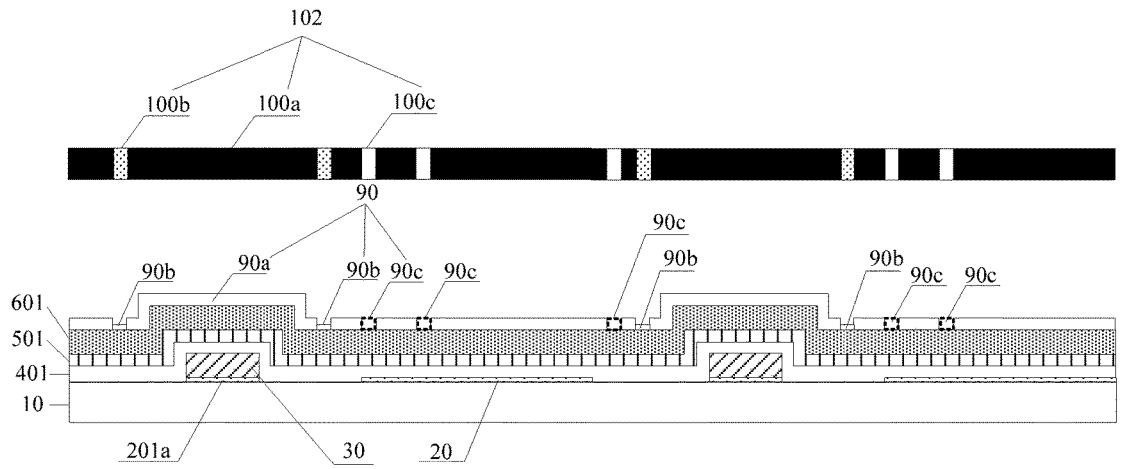
FIG. 15 is a schematic view 2 illustrating a fabrication process of forming a gate insulating layer, a metal oxide semiconductor active layer and an etch stop layer through one patterning process provided by an embodiment of the invention.

S222, on the substrate subjected to step S221, as illustrated in FIG. 15, the base substrate with the photoresist 90 formed thereon is exposed with a second gray-tone mask or a second half-tone mask 102, and after development, a photoresist fully-retained portion 90a, a photoresist half-retained portion 90b and a photoresist fully-removed portion 90c are formed.

The photoresist half-retained portion 90b corresponds to regions where a second via hole for connecting the source electrode 80a and the metal oxide semiconductor active layer 50, and a third via hole for connecting the drain electrode 80b and the metal oxide semiconductor active layer 50, are to be formed; the photoresist fully-removed portion 90c corresponds to regions where the first via hole for connecting the drain electrode 80b and the pixel electrode 20, a fourth via hole lying on the right side of the first via hole along the direction of the gate line 30 and next to the first via hole, and a fifth via hole lying on the right side of the fourth via hole and next to the second via hole, are to be formed; and the photoresist fully-retained portion 90a corresponds to other region.

Here, function of the fourth via hole and the fifth via hole is to partition the metal oxide semiconductor active layers 50 within two adjacent pixel units and a metal oxide semiconductor active layer retained pattern 501 between the two metal oxide semiconductor active layers 50.

Figure 16:
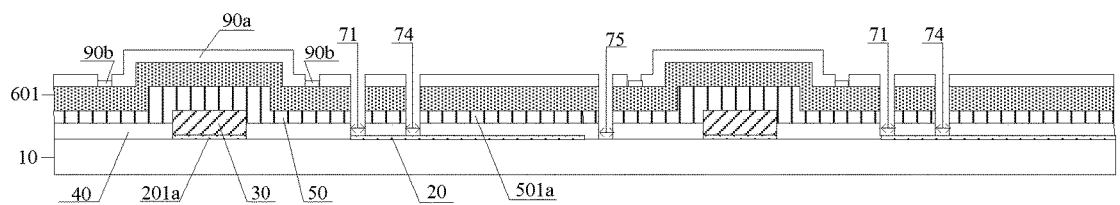
FIG. 16 is a schematic view 3 illustrating a fabrication process of forming a gate insulating layer, a metal oxide semiconductor active layer and an etch stop layer through one patterning process provided by an embodiment of the invention.

S223, on the substrate subjected to step S222, as illustrated in FIG. 16, the etch stop layer thin film 601, the metal oxide semiconductor active layer thin film 501, and the gate insulating layer thin film 401 of the photoresist fully-removed portion 90c are removed using etch process, so as to form the gate insulating layer 40 with the first via hole 71, the fourth via hole 74 and the fifth via hole 75, and to form a pattern layer including a metal oxide semiconductor active layer 50 with the first via hole 71 and the metal oxide semiconductor active layer retained pattern 501a.

Along the direction of the gate line 30, the metal oxide semiconductor active layer retained pattern 501 is confined by a region between the four via hole 74 and the fifth via hole 75 that are located between any two of the gate electrodes 30 that are adjacent. Along the direction of the gate line 30, the metal oxide semiconductor active layer 50 is confined by a region between the fourth via hole 74 and the fifth via hole 75 that are located on two sides of the gate electrode 30. That is, a fourth via hole 74 and a fifth via hole 75 are located between a first via hole 71 and a second via hole 72 between two adjacent gate electrodes 30, the fourth via hole 74 is close to the first via hole 71, and the fifth via hole 75 is close to the second via hole 72.

Figure 17:
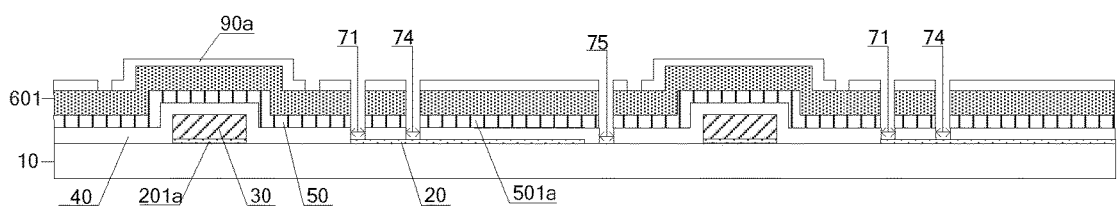
FIG. 17 is a schematic view 4 illustrating a fabrication process of forming a gate insulating layer, a metal oxide semiconductor active layer and an etch stop layer through one patterning process provided by an embodiment of the invention.

S224, on the substrate subjected to the step S223, as illustrated in FIG. 17, the photoresist of the photoresist half-retained portion 90b is removed using ashing process.

Figure 18:
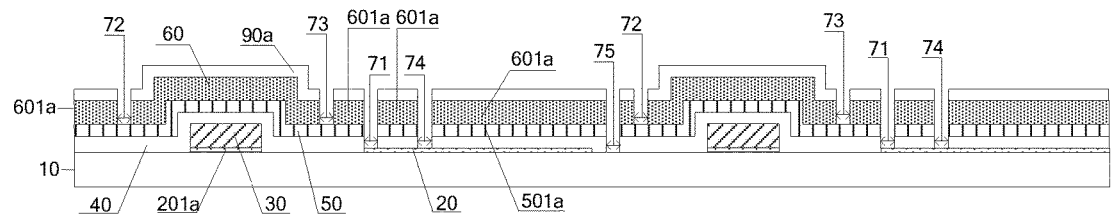
FIG. 18 is a schematic view 5 illustrating a fabrication process of forming a gate insulating layer, a metal oxide semiconductor active layer and an etch stop layer through one patterning process provided by an embodiment of the invention.

S225, on the substrate subjected to the step S224, as illustrated in FIG. 18, the exposed etch stop layer thin film 601 is removed using etch process, so as to form the second via hole 72 and the third via hole 73, and a pattern layer including the etch stop layer 60 and an etch stop layer retained pattern 601a.

Along the direction of the gate line 30, the etch stop layer 60 is confined by a region between the second via hole 72 and the third via hole 73 that are located on two sides of the gate electrode 30, and the other remaining etch stop layer thin film 601 is the etch stop layer retained pattern 601a.

Figure 19:
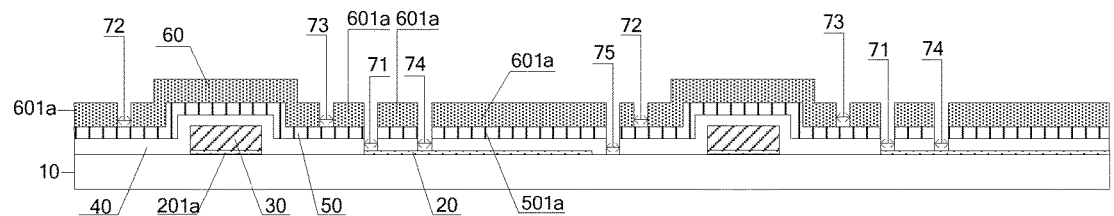
FIG. 19 is a schematic view 6 illustrating a fabrication process of forming a gate insulating layer, a metal oxide semiconductor active layer and an etch stop layer through one patterning process provided by an embodiment of the invention.

S226, on the substrate subjected to step S225, as illustrated in FIG. 19, the photoresist of the photoresist fully-retained portion 90a is removed using stripping process, so as to expose that etch stop layer 60 and the etch stop layer retained pattern 601a.

Here, considering that it is required for the drain electrode 80b to have a good electrical contact with each of the metal oxide semiconductor active layer 50 and the pixel electrode 20, for example, referring to that illustrated in FIG. 19, the first via hole 71 and the third via hole 73 have a spacing therebetween.

Figure 20:
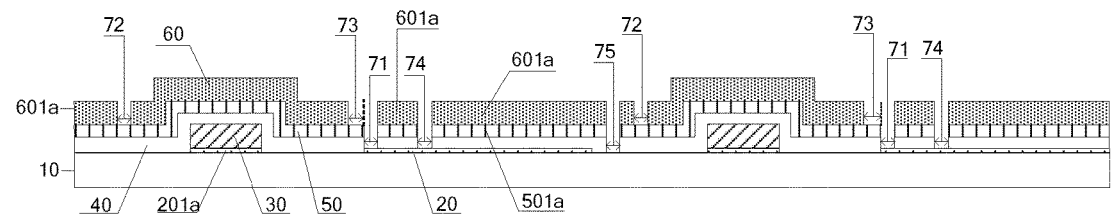
FIG. 20 is a schematic view 7 illustrating a fabrication process of forming a gate insulating layer, a metal oxide semiconductor active layer and an etch stop layer through one patterning process provided by an embodiment of the invention.

Certainly, as illustrated in FIG. 20, it is also possible that the first via hole 71 is joined to the third via hole 73. Namely, along the direction of the gate line 30, there is no spacing between the first via hole 71 and the third via hole 73.

By the above steps S211 to S217 or S221 to S226, it is possible that the gate insulating layer 40, the metal oxide semiconductor active layer 50 and the etch stop layer 60 are formed on the substrate with a pattern layer including the gate electrode 30 and the gate line 30 and a pattern layer including the pixel electrode 20 and the transparent conductive pattern layer 201a formed thereon.

On this basis, in view of the fact that the less the patterning process is carried out, the lower the fabricating cost of the array substrate 01 is, and accordingly, the more stable the performance of the array substrate 01 is, embodiments of the invention preferably adopt the second manner. That is, the gate insulating layer 40, the metal oxide semiconductor active layer 50 and the etch stop layer 60 are fully formed merely by one patterning process. Furthermore, in order to make sure that the drain electrode 80b has a good electrical contact with each of the metal oxide semiconductor active layer 50 and the pixel electrode 20, it is preferred that the first via hole 71 and the third via hole 73 have a spacing therebetween in embodiments of the invention.

For the above step S03, its concrete steps are as follows.

Figure 21:
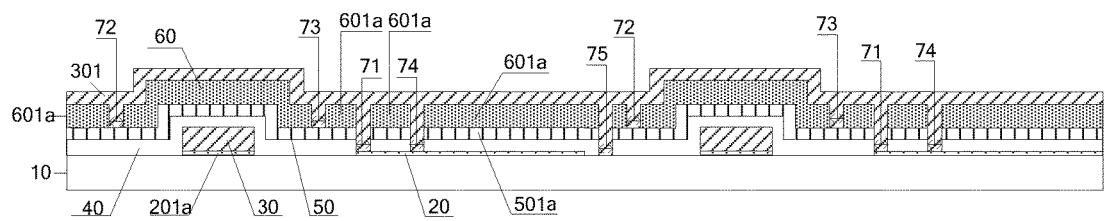
FIG. 21 is a schematic view 1 illustrating a fabrication process of forming a source electrode, a drain electrode and a data line through one patterning process provided by an embodiment of the invention.
Figure 22:
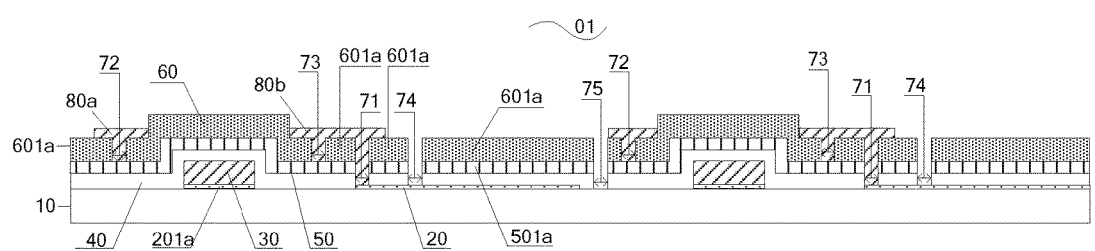
FIG. 22 is a schematic view 2 illustrating a fabrication process of forming a source electrode, a drain electrode and a data line through one patterning process provided by an embodiment of the invention.

As illustrated in FIG. 21, on the basis of the S221 to S226, a layer of metal thin film 301 is deposited by way of sputtering or thermal evaporation, and its thickness is, such as in the range of 2000 Å to 10000 Å. Further, as illustrated in FIG. 22, a pattern layer including the source electrode 80a, the drain electrode 80b and the data line 80a can be formed by a normal mask using one patterning process.

The source electrode 80a contacts the metal oxide semiconductor active layer 50 through the second via hole 72, and the drain electrode 80b contacts the metal oxide semiconductor active layer 50 through the third via hole 73, and is electrically connected to the pixel electrode 20 through the first via hole 71.

Figure 23:
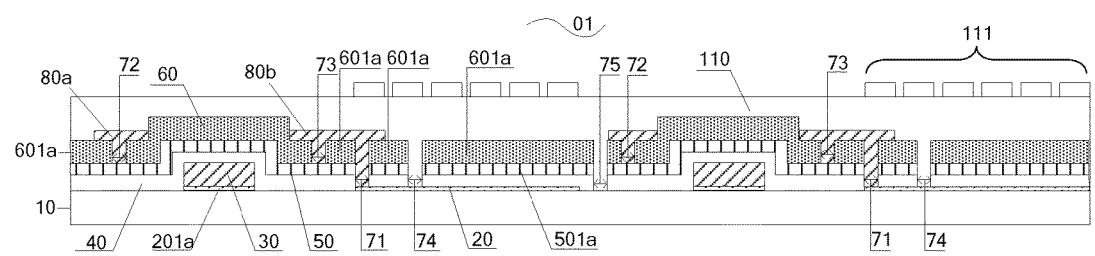
FIG. 23 is a schematic view illustrating a fabrication process of forming an array substrate that includes a passivation layer and a common electrode, provided by an embodiment of the invention.

Further, as illustrated in FIG. 23, a passivation layer 110 and a common electrode 111 may also be formed.

Hereinafter, by giving a specific embodiment, the manufacturing method of the array substrate 01 will be described in detail with reference to FIGS. 2 to 6, FIGS. 14 to 19 and FIG. 21 and FIG. 22.

S101, referring to that illustrated in FIG. 2, by way of sputtering, a layer of an ITO transparent conductive thin film 201 having a thickness of 1000 Å and a layer of a Mo metal thin film 301 having a thickness of 5000 Å are sequentially formed on the base substrate 10, and photoresist 90 is formed on the Mo metal thin film 301.

S102, on the substrate subjected to the step S101, referring to that illustrated in FIG. 2, the substrate with the photoresist 90 formed thereon is exposed with a third half-tone mask 103, and after development, a photoresist fully-retained portion 90a, a photoresist half-retained portion 90b and a photoresist fully-removed portion 90c are formed.

The photoresist fully-retained portion 90a corresponds to a region where a pattern layer including the gate electrode 30 and the gate line 30 is to be formed, the photoresist half-retained portion 90b corresponds to a region where a pattern layer including the pixel electrode 20 is to be formed, and the photoresist fully-removed portion 90c corresponds to other region.

S103, on the substrate subjected to the step S102, referring to that illustrated in FIG. 3, the metal thin film 301 and the transparent conductive thin film 201 of the photoresist fully-removed portion are removed using etch process, so as to form the pattern layer including the gate electrode 30 and the gate line 30 as well as a transparent conductive pattern layer 201a under the pattern layer including the gate electrode 30 and the gate line 30, the pixel electrode 20 and a part of the metal thin film 301a over the pixel electrode 20.

S104, on the substrate subjected to the step S103, referring to that illustrated in FIG. 4, the photoresist of the photoresist half-retained portion 90b is removed using ashing process.

S105, on the substrate subjected to the step S104, referring to that illustrated in FIG. 5, the part of the metal thin film 301a over the pixel electrode 20 that has been exposed is removed using etch process.

S106, on the substrate subjected to the step S105, referring to that illustrated in FIG. 6, the photoresist of the photoresist fully-retained portion 90a is removed using stripping process.

S107, on the substrate subjected to the step S106, referring to that illustrated in FIG. 14, in sequence, a layer of silicon nitride gate insulating layer thin film 401 having a thickness of 6000 Å is deposited by way of PECVD, a layer of IGZO metal oxide semiconductor active layer thin film 501 having a thickness of 1000 Å is deposited by way of thermal evaporation, and a layer of aluminum oxide etch stop layer thin film 601 having a thickness of 2000 Å is deposited by way of PECVD. And, photoresist 90 is formed on the etch stop layer thin film 601.

S108, on the substrate subjected to the step S107, referring to that illustrated in FIG. 15, the substrate with the photoresist 90 formed thereon is exposed with a second half-tone mask 102, and after development, a photoresist fully-retained portion 90a, a photoresist half-retained portion 90b and a photoresist fully-removed portion 90c are formed.

The photoresist half-retained portion 90b corresponds to regions where a second via hole 72 for connecting the source electrode 80a and the metal oxide semiconductor active layer 50, and a third via hole 73 for connecting the drain electrode 80b and the metal oxide semiconductor active layer 50, are to be formed; the photoresist fully-removed portion 90c corresponds to regions where the first via hole 71 for connecting the drain electrode 80b and the pixel electrode 20, a fourth via hole 74 lying on the right side of the first via hole 71 along the direction of the gate line 30 and next to the first via hole, and a fifth via hole 75 lying on the right side of the fourth via hole and next to the second via hole 72, are to be formed; and the photoresist fully-retained portion 90a corresponds to other region.

S109, on the substrate subjected to the step S108, referring to that illustrated in FIG. 16, the etch stop layer thin film 601, the metal oxide semiconductor active layer thin film 501 and the gate insulating layer thin film 401 of the photoresist fully-removed portion 90c are removed using etch process, so as to form the gate insulating layer 40 with the first via hole 71, the fourth via hole 74 and the fifth via hole 75, and to form a pattern layer including the metal oxide semiconductor active layer 50 with the first via hole 71 and a metal oxide semiconductor active layer retained pattern 501a.

The first via hole 71 and the third via hole 73 have a spacing therebetween. Moreover, along the direction of the gate line 30, the metal oxide semiconductor active layer retained pattern 501a is confined by a region between the fourth via hole 74 and the fifth via hole 75 that are located between any two of the gate electrodes 30 that are adjacent; and the metal oxide semiconductor active layer 50 is confined by a region between the fourth via hole 74 and the fifth via hole 75 that are located on two sides of the gate electrode 30.

S110, on the substrate subjected to the step S109, referring to that illustrated in FIG. 17, the photoresist of the photoresist half-retained portion 90b is removed using ashing process.

S111, on the substrate subjected to the step S110, referring to that illustrated in FIG. 18, the exposed etch stop layer thin film 601 is removed using etch process, so as to form the second via hole 72 and the third via hole 73, as well as a pattern layer including the etch stop layer 60 and an etch stop layer retained pattern 601a.

The etch stop layer 60 is confined by a region between the second via hole 72 and the third via hole 73 that are located on two sides of the gate electrode 30, and the other remaining etch stop layer thin film 601 is the etch stop layer retained pattern 601a.

S112, on the substrate subjected to the step S111, referring to that illustrated in FIG. 19, the photoresist of the photoresist fully-retained portion 90a is removed using stripping process.

S113, on the substrate subjected to the step S112, referring to that illustrated in FIG. 21, by way of sputtering, a layer of W metal thin film 301 having a thickness of 5000 Å is deposited.

S114, on the substrate subjected to the step S113, referring to that illustrated in FIG. 22, a pattern layer of the source electrode 80a, the drain electrode 80b and the data line 80a is formed by using a normal mask with one patterning process.

The source electrode 80a contacts the metal oxide semiconductor active layer 50 through the second via hole 72, and the drain electrode 80b contacts the metal oxide semiconductor active layer 50 through the third via hole 73, and is electrically connected to the pixel electrode 20 through the first via hole 71.

As such, through the above steps S101 to S14, by using a normal mask and a half-tone mask, the array substrate can be formed merely by using three patterning processes. As compared with six patterning processes in prior art, the process number is remarkably reduced, and the production efficiency of the array substrate is remarkably enhanced.

On the basis of the above, as illustrated in FIG. 23, further optionally, the manufacturing method of the array substrate 01 further includes that, a passivation layer 110 and a common electrode 111 are formed on the substrate with the pattern layer including the source electrode 80a, the drain electrode 80b and the data line 80a formed thereon.

According to an embodiment of the invention, there is further provided an array substrate 01 manufactured by using the above method. Referring to that illustrated in FIG. 22, the array substrate 01 includes a pattern layer including a gate electrode 30 and a gate line 30, a gate insulating layer 40, a metal oxide semiconductor active layer 50, a pixel electrode 20 and a pattern layer including a source electrode 80a, a drain electrode 80b and a data line 80a. In addition, the array substrate 01 further includes a transparent conductive pattern layer 201 disposed under the pattern layer including the gate electrode 30 and the gate line 30, and an etch stop layer 60 disposed over the metal oxide semiconductor active layer 50. The transparent conductive pattern lies in the same layer as the pixel electrode 20.

The source electrode 80a and the drain electrode 80b are located above the etch stop layer 60, and the drain electrode 80b is electrically connected to the pixel electrode 20 through a first via hole 71 located over the pixel electrode 20.

For example, the array substrate 01 further includes a metal oxide semiconductor active layer retained pattern 501a in the same layer as the metal oxide semiconductor active layer 50, and an etch stop layer retained pattern 601a in the same layer as the etch stop layer 60.

Along the direction of the gate line 30, the etch stop layer 60 is confined by a region between the second via hole 72 and the third via hole 73 that are located on two sides of the gate electrode 30, and the other remaining etch stop layer thin film 601 is the etch stop layer retained pattern 601a. Moreover, the metal oxide semiconductor active layer retained pattern 501a is confined by a region between the fourth via hole 74 located between any two adjacent gate electrodes 30 and close to the first via hole 71, and the fifth via hole 75 located on the right side of the fourth via hole 74 and close to the second via hole 72; and the metal oxide semiconductor active layer 50 is confined by a region between the fourth via hole 74 and the fifth via hole 75 that are located on two sides of the gate electrode 30.

Here, function of the second via hole 72 and the third via hole 73 is to expose the metal oxide semiconductor active layer 50. Function of the fourth via hole and the fifth via hole is to partition the metal oxide semiconductor active layers 50 within two adjacent pixel units and a metal oxide semiconductor active layer retained pattern 501a between the two metal oxide semiconductor active layers 50.

On this basis, the source electrode 80a contacts the metal oxide semiconductor active layer 50 through the second via hole 72, and the drain electrode 80b contacts the metal oxide semiconductor active layer 50 through the third via hole 73, and is electrically connected to the pixel electrode 20 through the first via hole 71.

Here, considering that it is required for the drain electrode 80b to have a good electrical contact with each of the metal oxide semiconductor active layer 50 and the pixel electrode 20, preferably, referring to that illustrated in FIG. 22, in the array substrate 01, the first via hole 71 and the third via hole 73 have a spacing therebetween.

Of course, optionally, as illustrated in FIG. 20, in the array substrate 01, the first via hole 71 is joined to the third via hole 73. Namely, along the direction of the gate line 30, there is no spacing between the first via hole 71 and the third via hole 73.

Further optionally, referring to that illustrated in FIG. 23, the array substrate 01 further includes a passivation layer 110 and a common electrode 11 sequentially disposed on the substrate.

Here, the common electrode 111 located on top may be a strip-like electrode containing a plurality of electrical connections, and the common electrode 111 is a slit structure or a comb-like structure; and the pixel electrode 20 located beneath is a plate-like electrode.

According to an embodiment of the invention, there is further provided a display device, comprising any of the array substrates 01 as stated above.

The display device provided by embodiments of the invention may be a liquid crystal panel, an electronic paper, a liquid crystal television, a liquid crystal display, a digital photo frame, a cell phone, a tablet computer or other product or component having any display function.

Based on the above descriptions, those skilled in the art shall understand that, all drawings in embodiments of the invention are merely abbreviated, schematic view of the array substrate, and are just used to clearly describe structures relative to the inventive point in the scheme, and other structures irrelative to the inventive point are existing structures, and are not embodied or only partially embodied in the drawings.

In addition, although in each of embodiments of the invention, descriptions have been made with reference to an example in which the drain electrode is electrically connected to the pixel electrode, those skilled in the art should understand that, owing to the interchangeability between the source electrode and the drain electrode of a thin film transistor in terms of structure and composition, the source electrode may also be connected to the pixel electrode. This belongs to an equivalent transformation of the above embodiments of the invention.

Descriptions made above are merely exemplary embodiments of the invention, and are not used to limit the protection scope of the invention. The protection scope of the invention is determined by attached claims.

This application claims the benefit of priority from Chinese patent application No. 201310597112.5, filed on Nov. 22, 2013, the disclosure of which is incorporated herein in its entirety by reference as a part of the present application.

What is claimed is:

1. A manufacturing method of an array substrate, comprising:
forming, on a base substrate and via one patterning process, a transparent conductive pattern layer, a pattern layer including a pixel electrode, and a pattern layer including a gate electrode and a gate line, the transparent conductive pattern lying in a same level as the pixel electrode;
on the substrate with the pattern layer including the gate electrode and the gate line formed thereon, through one patterning process or two patterning processes, forming a gate insulating layer, a pattern layer at least including a metal oxide semiconductor active layer and a pattern layer at least including an etch stop layer, wherein the etch stop layer comprises a first portion which is, along a gate line direction, between a second via hole and a third via hole that are located on two sided of the gate electrode; wherein, a first via hole for exposing the pixel electrode is formed over the pixel electrode; and
on the substrate with the etch stop layer formed thereon, through one patterning process, forming a pattern layer including a source electrode, a drain electrode and a data line, wherein, the source electrode and the drain electrode each contact with the metal oxide semiconductor active layer, and the drain electrode and the pixel electrode are electrically connected through the first via hole.

2. The manufacturing method according to claim 1, wherein, on the substrate with the pattern layer including the gate electrode and the gate line formed thereon, through one patterning process or two patterning processes, forming the gate insulating layer, the pattern layer at least including the metal oxide semiconductor active layer and the pattern layer at least including the etch stop layer includes:
on the substrate with the pattern layer including the gate electrode and the gate line formed thereon, forming a gate insulating layer thin film, a metal oxide semiconductor active layer thin film and an etch stop layer thin film in sequence, and forming photoresist on the etch stop layer thin film;
conducting an exposure of the substrate with the photoresist formed thereon by using a second gray-tone mask or a second half-tone mask, so as to form a photoresist fully-retained portion, a photoresist half-retained portion and a photoresist fully-removed portion after development; wherein, the photoresist half-retained portion corresponds to regions where a second via hole for connecting the source electrode and the metal oxide semiconductor active layer, and a third via hole for connecting the drain electrode and the metal oxide semiconductor active layer are to be formed; the photoresist fully-removed portion corresponds to the first via hole for connecting the drain electrode and the pixel electrode, and a fourth via hole and a fifth via hole, which are to be formed so that the fourth via hole and the fifth via hole are located between the first via hole and the second via hole that are located between two adjacent gate electrodes, the fourth via hole is close to the first via hole, and the fifth via hole is close to the second via hole; and the photoresist fully-retained portion corresponds to the other region;
removing the etch stop layer thin film, the metal oxide semiconductor active layer thin film and the gate insulating layer thin film of the photoresist fully-removed portion by using an etch process, so as to form the gate insulating layer with the first via hole, the fourth via hole and the fifth via hole, and to form a pattern layer including the metal oxide semiconductor active layer with the first via hole and a metal oxide semiconductor active layer retained pattern; wherein, the metal oxide semiconductor active layer retained pattern is confined by a region between the fourth via hole and the fifth via hole that are located between any two of the gate electrodes that are adjacent;
removing the photoresist of the photoresist half-retained portion by using an ashing process;
removing exposed etch stop layer thin film by using etch process, so as to form the second via hole and the third via hole, as well as a pattern layer including the first portion of the etch stop layer and a second portion of the etch stop layer which is an etch stop layer retained pattern; wherein, other remaining etch stop layer thin film is the etch stop layer retained pattern; and
removing the photoresist of the photoresist fully-retained portion by using a stripping process.

3. The manufacturing method according to claim 2, wherein, the first via hole and the third via hole have a spacing therebetween.

4. The manufacturing method according to claim 2, wherein, the first via hole is joined to the third via hole.

5. The manufacturing method according to claim 1, wherein, forming the transparent conductive pattern layer, the pattern layer including the pixel electrode, and the pattern layer including the gate electrode and the gate line includes:
sequentially forming a transparent conductive thin film and a metal thin film on the base substrate, and forming photoresist on the metal thin film;
conducting an exposure of the substrate with the photoresist formed thereon by using a third gray-tone mask or a third half-tone mask, so as to form a photoresist fully-retained portion, a photoresist half-retained portion and a photoresist fully-removed portion after development; wherein, the photoresist fully-retained portion corresponds to a region where the pattern layer including the gate electrode and the gate line is to be formed, the photoresist half-retained portion corresponds to a region where the pattern layer including the pixel electrode is to be formed, and the photoresist fully-removed portion corresponds to the other region;
removing the metal thin film and the transparent conductive thin film of the photoresist fully-removed portion by using an etch process, so as to form the pattern layer including the gate electrode and the gate line as well as a transparent conductive pattern layer under the pattern layer including the gate electrode and the gate line, the pixel electrode, and a part of metal thin film over the pixel electrode;
removing the photoresist of the photoresist half-retained portion by using an ashing process;
removing the part of the metal thin film over the pixel electrode that has been exposed by using etch process; and
removing the photoresist of the photoresist fully-retained portion by using stripping process.

6. The manufacturing method according to claim 1, further comprising, forming a passivation layer and a common electrode on the substrate with the source electrode, the drain electrode and the data line formed thereon.

7. An array substrate, comprising:
a pattern layer including a gate electrode and a gate line;
a gate insulating layer;
a metal oxide semiconductor active layer;

a pixel electrode; and a pattern layer including a source electrode, a drain electrode and a data line; wherein, the array substrate further includes:

a transparent conductive pattern layer disposed under the pattern layer including the gate electrode and the gate line, the transparent conductive pattern lying in a same level as the pixel electrode; and an etch stop layer disposed over the metal oxide semiconductor active layer, wherein, the source electrode and the drain electrode are located over the etch stop layer, and the drain electrode is electrically connected to the pixel electrode through a first via hole located over the pixel electrode, wherein the etch stop layer comprises a first portion which is, along a gate line direction, between a second via hole and a third via hole that are located on two sides of the gate electrode.

8. The array substrate according to claim 7, further comprising: a metal oxide semiconductor active layer retained pattern in the same layer as the metal oxide semiconductor active layer; and a second portion of the etch stop layer, which is an etch stop layer retained pattern in the same layer as the first portion of the etch stop layer;

wherein, the metal oxide semiconductor active layer retained pattern is confined by a region between a fourth via hole located between any two of the gate electrodes that are adjacent and close to the first via hole, and a fifth via hole located on the right side of the fourth via hole and close to the second via hole; and the source electrode contacts the metal oxide semiconductor active layer through the second via hole, the drain electrode contacts the metal oxide semiconductor active layer through the third via hole, and the drain electrode is electrically connected to the pixel electrode through the first via hole.

9. The array substrate according to claim 8, wherein, the first via hole and the third via hole have a spacing therebetween.

10. The array substrate according to claim 8, wherein, the first via hole is joined to the third via hole.

11. The array substrate according to claim 7, wherein, the array substrate further includes a passivation layer and a common electrode.

12. A display device, comprising the array substrate according to claim 7.

13. The array substrate according to claim 9, wherein, the first via hole is joined to the third via hole.

14. The array substrate according to claim 8, wherein, the array substrate further includes a passivation layer and a common electrode.

15. The display device according to claim 12, further comprising: a metal oxide semiconductor active layer retained pattern in the same layer as the metal oxide semiconductor active layer; and a second portion of the etch stop layer, which is an etch stop layer retained pattern in the same layer as the first portion of the etch stop layer;

wherein, the metal oxide semiconductor active layer retained pattern is confined by a region between a fourth via hole located between any two of the gate electrodes that are adjacent and close to the first via hole, and a fifth via hole located on the right side of the fourth via hole and close to the second via hole; and the source electrode contacts the metal oxide semiconductor active layer through the second via hole, the drain electrode contacts the metal oxide semiconductor active layer through the third via hole, and the drain electrode is electrically connected to the pixel electrode through the first via hole.

16. The display device according to claim 15, wherein, the first via hole and the third via hole have a spacing therebetween.

17. The display device according to claim 15, wherein, the first via hole is joined to the third via hole.

18. The display device according to claim 12, wherein, the array substrate further includes a passivation layer and a common electrode.

* * * * *